US010716236B2

(12) United States Patent
Malone et al.

(10) Patent No.: US 10,716,236 B2
(45) Date of Patent: Jul. 14, 2020

(54) COOLING A DATA CENTER

(71) Applicant: Google LLC, Mountain View, CA (US)

(72) Inventors: Christopher G. Malone, Mountain View, CA (US); Thomas R. Kowalski, Santa Cruz, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/707,100

(22) Filed: Sep. 18, 2017

(65) Prior Publication Data

US 2018/0063990 A1   Mar. 1, 2018

Related U.S. Application Data

(63) Continuation of application No. 15/016,018, filed on Feb. 4, 2016, now Pat. No. 9,769,953.

(51) Int. Cl.
*H05K 7/20* (2006.01)
(52) U.S. Cl.
CPC ....... *H05K 7/20145* (2013.01); *H05K 7/2079* (2013.01); *H05K 7/20736* (2013.01); *H05K 7/20745* (2013.01)

(58) Field of Classification Search
CPC ....... G06F 1/181–182; H05K 7/20218–20381; H05K 7/20409–20418;
(Continued)

(56) References Cited

U.S. PATENT DOCUMENTS 6,034,873 A * 3/2000 Stanghl ............... H05K 7/20745
165/80.3
7,430,118 B1 * 9/2008 Noteboom ......... H05K 7/20745
361/695
(Continued)

FOREIGN PATENT DOCUMENTS

| CN | 1777855 A | 5/2006 | |
|---|---|---|---|
| CN | 103477299 A | 12/2013 | |
| CN | 104536549 A | 4/2015 | |
| EP | 0458770 A1 * | 11/1991 | ......... H05K 7/20745 |
| JP | 2012038100 A1 | 2/2012 | |
| JP | 2015-195034 A | 11/2015 | |

(Continued)

OTHER PUBLICATIONS

'opencompute.org' [online]. "Faster, Leaner, Smarter, Better Data Centers," Mar. 2014, [retrieved on Oct. 25, 2016]. Retrieved from the Internet: URL<http://www.opencompute.org/blog/faster-leaner-smarter-better-data-centers/>. 8 pages.

(Continued)

*Primary Examiner* — Robert J Hoffberg
(74) *Attorney, Agent, or Firm* — Fish & Richardson P.C.

(57) ABSTRACT

Techniques for cooling a data center include circulating an airflow, to a warm air plenum of a first module, from rows of racks that support a heat-generating electronic devices; warming the airflow circulated through the racks; circulating the warmed airflow through a warm air inlet of the warm air plenum that is adjacent an open side of the racks and to a warmed air outlet adjacent a data center volume above the racks; circulating the airflow, with a fan positioned in a second module positioned in the data center volume above the racks, through at least one cooling module to cool the warmed airflow, and into a human-occupiable workspace of the data center adjacent the racks; and diverting the warmed airflow with an airflow partition mounted in the data center volume above the racks and adjusted to interrupt the warmed airflow between the warmed air plenum and the human-occupiable workspace.

19 Claims, 3 Drawing Sheets

(58) Field of Classification Search
CPC ... H05K 7/20009–202; H05K 7/20145; H05K 7/20736; H05K 7/20745; H05K 7/2079; H05K 7/20827; H01L 23/367–3677; H01L 23/473; H01L 23/46–467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 7,800,900 B1* | 9/2010 | Noteboom | H05K 7/20745 | 361/679.47 |
| 7,944,692 B2* | 5/2011 | Grantham | H05K 7/20745 | 361/688 |
| 8,031,468 B2 | 10/2011 | Bean | | |
| 8,054,625 B2* | 11/2011 | Noteboom | H05K 7/20736 | 361/688 |
| 8,072,780 B1* | 12/2011 | Roy | H05K 7/20745 | 361/825 |
| 8,174,829 B1* | 5/2012 | Rotheroe | H05K 7/20745 | 165/80.4 |
| 8,184,435 B2* | 5/2012 | Bean, Jr. | H05K 7/20745 | 165/104.33 |
| 8,251,784 B2* | 8/2012 | Dawson | H05K 7/20745 | 160/137 |
| 8,628,158 B2* | 1/2014 | Caveney | H05K 7/20745 | 312/204 |
| 9,101,081 B2 | 8/2015 | Slaby et al. | | |
| 9,317,080 B2* | 4/2016 | Mikami | G06F 1/20 | |
| 9,622,389 B1* | 4/2017 | Roy | H05K 7/20745 | |
| 9,635,780 B2* | 4/2017 | Bernard | H05K 7/20745 | |
| 9,769,953 B2* | 9/2017 | Malone | H05K 7/20145 | |
| 9,839,163 B2* | 12/2017 | Keisling | H05K 7/20736 | |
| 10,165,710 B1* | 12/2018 | Pompei | H05K 7/20745 | |
| 10,531,597 B1* | 1/2020 | Eichelberg | H05K 7/20136 | |
| 2007/0135032 A1* | 6/2007 | Wang | F24F 9/00 | 454/184 |
| 2007/0146994 A1* | 6/2007 | Germagian | H05K 7/20745 | 361/695 |
| 2007/0281639 A1* | 12/2007 | Clidaras | G06F 1/20 | 455/128 |
| 2008/0198549 A1 | 8/2008 | Rasmussen | | |
| 2008/0209931 A1* | 9/2008 | Stevens | F28D 15/0275 | 361/699 |
| 2008/0273306 A1 | 11/2008 | Campbell | | |
| 2009/0173473 A1* | 7/2009 | Day | H05K 7/20754 | 165/67 |
| 2009/0241578 A1 | 10/2009 | Carlson | | |
| 2009/0251860 A1* | 10/2009 | Belady | H05K 7/1497 | 361/690 |
| 2009/0277605 A1 | 11/2009 | VanGilder | | |
| 2009/0305625 A1 | 12/2009 | Dawson | | |
| 2009/0326721 A1* | 12/2009 | Sugiyama | F24F 11/0001 | 700/282 |
| 2010/0027216 A1* | 2/2010 | Matsushima | H05K 7/20745 | 361/679.49 |
| 2010/0110626 A1* | 5/2010 | Schmitt | H05K 7/1497 | 361/679.47 |
| 2010/0165572 A1 | 7/2010 | Fink | | |
| 2010/0248609 A1* | 9/2010 | Tresh | H05K 7/20745 | 454/184 |
| 2010/0300648 A1* | 12/2010 | Grantham | H05K 7/20172 | 165/55 |
| 2011/0122570 A1 | 5/2011 | Beck | | |
| 2011/0240497 A1* | 10/2011 | Dechene | E04H 5/02 | 206/320 |
| 2012/0155027 A1 | 6/2012 | Broome | | |
| 2012/0229972 A1* | 9/2012 | Bean, Jr. | H05K 7/20745 | 361/679.46 |
| 2013/0032310 A1 | 2/2013 | Jaena | | |
| 2013/0048266 A1 | 2/2013 | Bauchot | | |
| 2013/0088833 A1* | 4/2013 | Cox | H05K 7/20736 | 361/689 |
| 2013/0188310 A1 | 7/2013 | Noteboom | | |
| 2014/0059945 A1 | 3/2014 | Gardner | | |
| 2014/0211411 A1* | 7/2014 | Slaby | H05K 7/20745 | 361/679.46 |
| 2014/0259966 A1 | 9/2014 | Totani | | |
| 2014/0321050 A1* | 10/2014 | Sato | G06F 1/20 | 361/679.47 |
| 2014/0343745 A1* | 11/2014 | Slessman | B31C 9/00 | 700/297 |
| 2014/0355203 A1 | 12/2014 | Kondo | | |
| 2015/0036293 A1* | 2/2015 | Martini | F24F 11/0001 | 361/695 |
| 2015/0105930 A1* | 4/2015 | Sparrowhawk | G01R 11/04 | 700/297 |
| 2015/0145391 A1 | 5/2015 | Broome | | |
| 2015/0195958 A1* | 7/2015 | Keisling | H05K 7/20745 | 361/679.47 |
| 2015/0230364 A1* | 8/2015 | Wands | H05K 7/20145 | 454/184 |
| 2015/0342094 A1 | 11/2015 | Ross | | |
| 2015/0342096 A1* | 11/2015 | Czamara | H05K 7/1497 | 361/679.49 |
| 2017/0006737 A1* | 1/2017 | Gardner | H05K 7/20745 | |
| 2017/0086485 A1* | 3/2017 | Tippmann | A23L 3/364 | |
| 2017/0127569 A1* | 5/2017 | Rimler | F24F 13/0227 | |
| 2018/0066859 A1* | 3/2018 | Nguyen | H05K 7/20745 | |
| 2018/0070475 A1* | 3/2018 | Ross | H05K 7/20727 | |
| 2018/0192550 A1* | 7/2018 | Noteboom | H05K 7/20745 | |

FOREIGN PATENT DOCUMENTS

| | | | | |
|---|---|---|---|---|
| WO | WO-2013066174 A1 * | 5/2013 | | H05K 7/20836 |
| WO | WO-2013066175 A1 * | 5/2013 | | H05K 7/20745 |
| WO | 2016/018996 | 2/2016 | | |

OTHER PUBLICATIONS

Extended European Search Report issued in European Application No. 16201792, dated Jun. 12, 2017, 8 pages.
JP Office action issued in Japanese Application No. 2016-238369, dated Oct. 2, 2018, 2 page (with English Translation).
JP Office Action issued in Japanese Application No. 2016-238369, dated Jan. 8, 2019, 4 pages (with English translation).
CN Office Action issued in Chinese Application No. dated Sep. 30, 2018, 20 pages (with English translation).
EP Office Action in European Application No. 16201792, dated Oct. 8, 2019, 7 pages.
EP Office Action in European Application No. 16201792, dated Feb. 12, 2020, 6 pages.
CN Office Action in Chinese Application No. 201611182151.9, dated Mar. 24, 2020, 4 pages (with English translation).

* cited by examiner

COOLING A DATA CENTER

CROSS-REFERENCE TO RELATED APPLICATION

This application is a continuation of, and claims priority under 35 U.S.C. § 120 to, U.S. patent application Ser. No. 15/016,018, filed Feb. 4, 2016, and entitled "Cooling a Data Center," the entire contents of which are incorporated herein by reference.

TECHNICAL FIELD

The present disclosure relates to systems and methods for cooling data center systems and computing components.

BACKGROUND

Data centers house various computing systems and components such as computer processors, storage systems or drives, servers, and other computing components. A data center may take up a room in a building, an entire building itself and may be stationary in form or may be portable, for example housed in a shipping container. A data center, whether stationary or portable, may also be modular. The computer related components housed in a data center consume significant amounts of electrical power and thereby produce significant amounts of heat during computing and storage operations. If the computer related components exceed certain temperatures, the performance of the components can be compromised and/or the components may fail. Accordingly, cooling systems are generally implemented to maintain proper and efficient functioning of the computer related components housed in a data center as the components operate to transfer, process, and store data. The cooling systems may include components configured to move fluids such as air or liquid through various configurations and based on varying conditions.

SUMMARY

In a general implementation, a data center cooling system includes a first module including a warm air plenum positionable to receive an airflow from one or more rows of racks that support a plurality of heat-generating electronic devices, the warm air plenum including a warmed air inlet adjacent an open side of the one or more racks and a warmed air outlet adjacent a data center volume above the one or more racks; a second module positionable in the data center volume above the one or more racks and including at least one fan and at least one cooling module, the fan positioned to circulate a warmed airflow from the one or more racks, through the warm air plenum, into the data center volume, through the cooling module to cool the warmed airflow, and into a human-occupiable workspace of the data center adjacent the one or more racks; and an airflow partition mountable in the data center volume above the one or more racks and adjustable to interrupt the warmed airflow between the warmed air plenum and the human-occupiable workspace.

In an aspect combinable with the general implementation, at least one of the first or second modules is attachable to a structural column of the data center.

In another aspect combinable with any of the previous aspects, the first or second module is moveable along the structural column.

In another aspect combinable with any of the previous aspects, the second module includes a plurality of vertical side panels coupled to a horizontal bottom panel.

In another aspect combinable with any of the previous aspects, the cooling module includes a cooling coil vertically mounted adjacent at least one of the vertical side panels.

In another aspect combinable with any of the previous aspects, at least one of the side panels is sized for replacement with another cooling module.

In another aspect combinable with any of the previous aspects, the fan is mounted in the horizontal bottom panel to circulate the warmed airflow orthogonally from the warmed air plenum through the cooling module.

In another aspect combinable with any of the previous aspects, the first module includes a flexible interface attachable between the warmed air plenum and a top portion of the one or more racks, the flexible interface including a fluid seal between the one or more racks and the data center volume above the one or more racks.

Another aspect combinable with any of the previous aspects further includes a ceiling panel horizontally attachable to at least one of the lower module or the upper module.

In another aspect combinable with any of the previous aspects, the ceiling panel defines an interface between the human-occupiable workspace and the data center volume above the one or more racks.

In another general implementation, a method of cooling a data center includes circulating an airflow, to a warm air plenum of a first module, from one or more rows of racks that support a plurality of heat-generating electronic devices; warming the airflow as the airflow is circulated through the racks; circulating the warmed airflow through a warm air inlet of the warm air plenum that is adjacent an open side of the one or more racks and to a warmed air outlet adjacent a data center volume above the one or more racks; circulating the airflow, with a fan positioned in a second module positioned in the data center volume above the one or more racks, through at least one cooling module to cool the warmed airflow, and into a human-occupiable workspace of the data center adjacent the one or more racks; and diverting the warmed airflow with an airflow partition mounted in the data center volume above the one or more racks and adjusted to interrupt the warmed airflow between the warmed air plenum and the human-occupiable workspace.

An aspect combinable with the general implementation further includes installing the first module in the human occupiable workspace of the data center; installing the second module in the data center volume; and attaching at least one of the first or second modules to a structural column of the data center.

Another aspect combinable with any of the previous aspects further includes detaching the portion of one of the first or second modules that is anchored to the structural column; and moving the portion of one of the first or second modules along the structural column or to another column.

In another aspect combinable with any of the previous aspects, the second module includes a plurality of vertical side panels coupled to a horizontal bottom panel.

Another aspect combinable with any of the previous aspects further includes installing the cooling module that includes a cooling coil vertically mounted adjacent at least one of the vertical side panels.

Another aspect combinable with any of the previous aspects further includes replacing at least one of the side panels with another cooling module that includes a cooling coil.

Another aspect combinable with any of the previous aspects further includes mounting the fan in the horizontal bottom panel to circulate the warmed airflow orthogonally from the warmed air plenum through the cooling module.

Another aspect combinable with any of the previous aspects further includes installing a flexible interface between the warmed air plenum and a top portion of the one or more racks; and fluidly sealing, with the flexible interface, a warm air aisle in between the one or more racks from the data center volume above the one or more racks.

Another aspect combinable with any of the previous aspects further includes installing a ceiling panel horizontally to at least one of the lower module or the upper module, the ceiling panel defining an interface between the human-occupiable workspace and the data center volume above the one or more racks.

In another general implementation, a method of cooling a data center includes installing a first data center module that includes a pre-determined amount of computing power into a human-occupiable workspace of a data center. The first data center module includes a first lower module including a warm air plenum positioned to receive an airflow from two rows of racks that support a plurality of heat-generating electronic devices, the warm air plenum including a warmed air inlet adjacent an open side of the one or more racks and a warmed air outlet adjacent a data center volume above the one or more racks; a first upper module positioned in the data center volume above the one or more racks and including at least one fan and at least one cooling coil; and a first airflow partition mountable in the data center volume to interrupt warmed airflow between the warmed air plenum of the first upper module and the human-occupiable workspace. The method includes operating the fan to circulate a warmed airflow from the one or more racks, through the warmed air plenum, into the data center volume, through the cooling coil to cool the warmed airflow, and into a human-occupiable workspace of the data center adjacent the one or more racks.

An aspect combinable with the general implementation further includes determining that the pre-determined amount of computing power of the first data center module is less than a desired amount of computing power; and based on the determination, installing a second data center module that includes the pre-determined amount of computing power into the human-occupiable workspace of the data center. The second data center module includes a second lower module including a warm air plenum positioned to receive an airflow from two rows of racks that support a plurality of heat-generating electronic devices, the warm air plenum including a warmed air inlet adjacent an open side of the one or more racks and a warmed air outlet adjacent a data center volume above the one or more racks; a second upper module positioned in the data center volume above the one or more racks and including at least one fan and at least one cooling coil; and a second airflow partition mountable in the data center volume to interrupt warmed airflow between the warmed air plenum of the second lower module and the human-occupiable workspace.

Another aspect combinable with any of the previous aspects further includes operating the plurality of heat-generating devices in the data center; determining that a first portion of the plurality of heat-generating devices are operating at a higher power or a higher temperature than a second portion of the plurality of heat-generating devices; and based on the determination, moving at least one of the first or second airflow partitions to direct a greater volume of a cooling airflow to the first portion of the plurality of heat-generating devices.

Implementations according to the present disclosure may include one or more of the following features. For example, implementations of a data center cooling system according to the present disclosure may be modular and scalable to account for different sized (e.g., total power) data centers. For example, the data center cooling system can be scalable between, e.g., 500 kW data centers (e.g., IT power) and 500 MW data centers. As another example, the scalable data center cooling system can be included of modular, factory-assembled components to reduce a construction schedule of the data center. Further, the data center cooling system may have significant deployment efficiency, allowing for changeable quantities and dimensions of, e.g., rows of electronic device racks, changeable power densities, and otherwise. As yet a further example, the data center cooling system may have significant power and cooling efficiency, such that units of IT power (e.g., racks of servers) may be installed to share cooling and allow for over-subscription of power infrastructure (e.g., maximum power available less than maximum rated IT power). As yet another example, the data center cooling system may allow for more efficient costs of small-scale data centers by utilizing similar modules that are used to build large data centers, by taking advantage of the economies of scale and reduction in costly, specialized equipment designed for small-scale data centers.

The details of one or more implementations of the subject matter described in this disclosure are set forth in the accompanying drawings and the description below. Other features, aspects, and advantages of the subject matter will become apparent from the description, the drawings, and the claims.

DETAILED DESCRIPTION

Figure 1A:
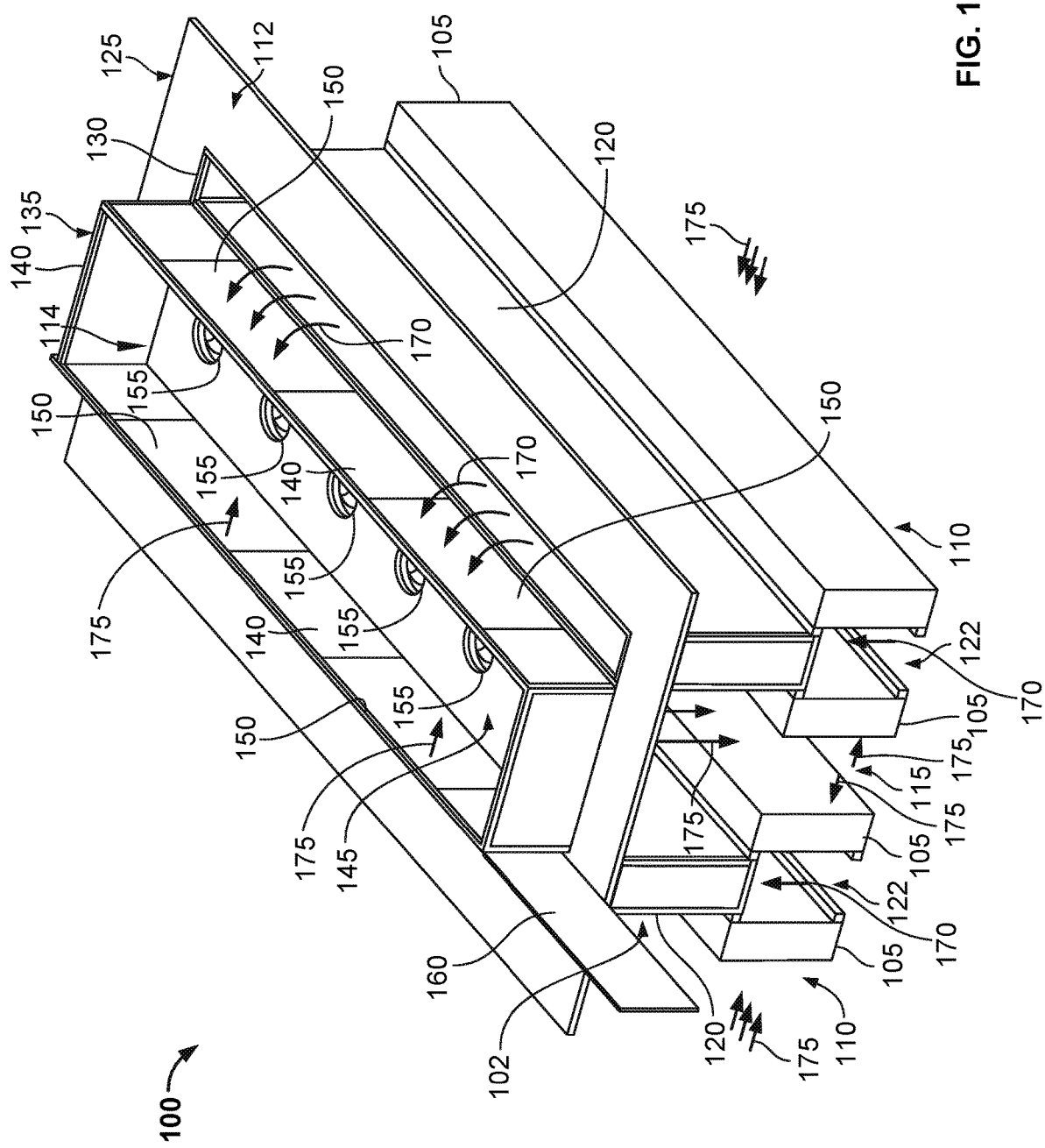
FIG. 1A is an isometric view of a schematic illustration of a scalable data center cooling module according to the present disclosure.
Figure 1B:
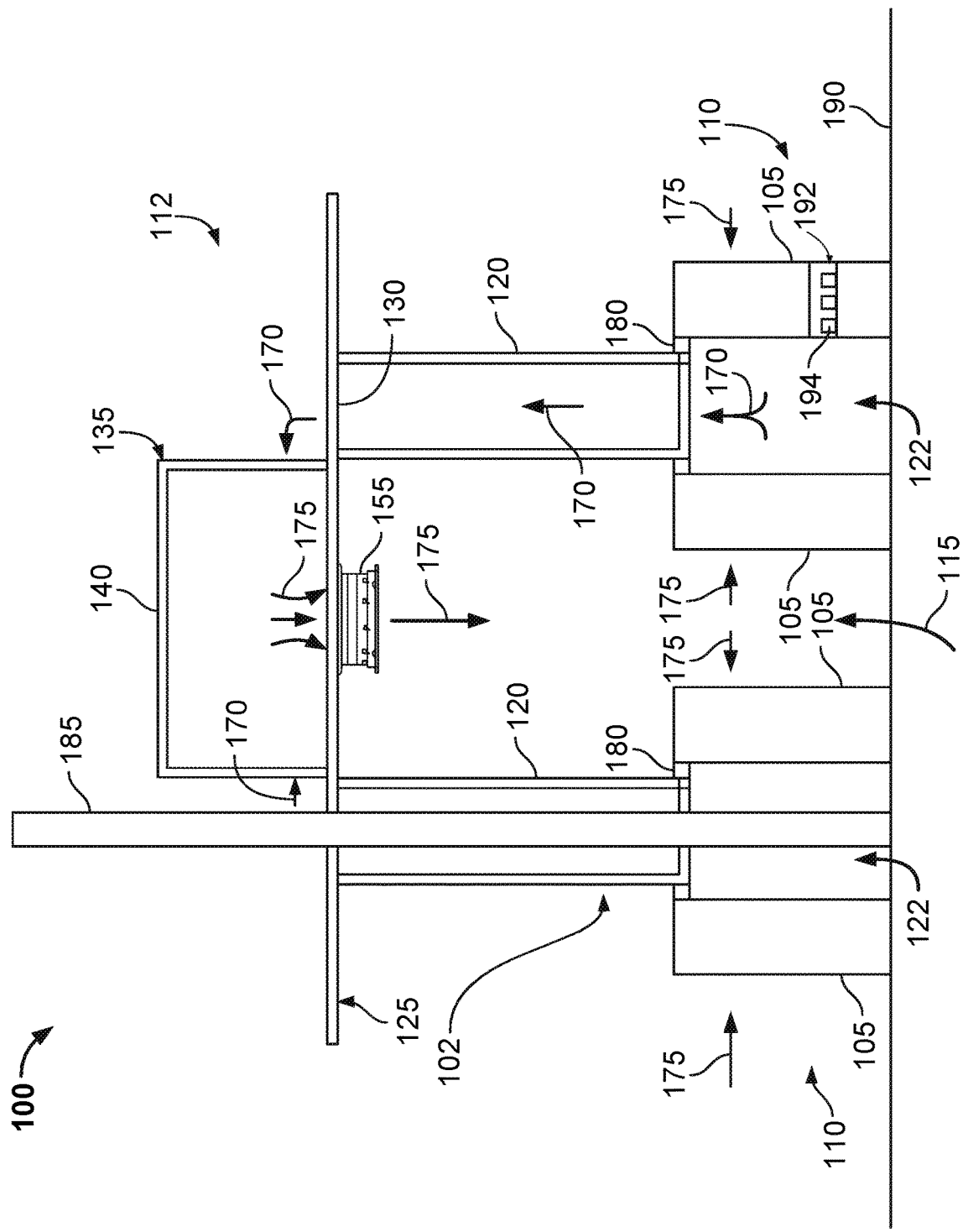
FIG. 1B is a side view of a schematic illustration of a scalable data center cooling module according to the present disclosure.

FIGS. 1A-1B are an isometric and side view, respectively, of a schematic illustration of a scalable data center cooling module 100. Generally, the data center cooling module 100 includes a lower module 102 and an upper module 135 that operate to cool heat-generating electronic devices (e.g., servers, processors, network devices, or other electronic devices) supported in rows of racks 105. In this example, heat-generating devices 194 are shown in a tray 192 on the rack 105 in FIG. 1B. The racks 105 may support multiple trays 194, which may be mounted vertically or horizontally, and may include one or more motherboards or daughter-boards to support the heat-generating devices 194.

The heat-generating electronic 194 devices in the racks 105 may be implemented for processing, transmitting and/or storing data. The heat-generating electronic devices 194 may include other computing devices or components related to the operation of the servers. The heat-generating computing devices 194 generate heat as the devices operate to process, transmit, and store data locally and with remote computing systems. In the case of servers, for example, the devices 194 may, for example be connected to a local or remote network and may receive and respond to various requests from the network to retrieve, process, and/or store data. The servers may facilitate communication over the Internet or an intranet to permit interaction with a plurality of remote computers and to provide requested services via applications running on the remote computers or on the servers. Accordingly, the data center cooling module 100 may include or be electrically coupled to one or more power source for powering the servers and related components and includes a communication interface which may be configured for wired and wireless transmissions to and from the data center. The power source may be connected to a power grid or may be generated by batteries or an on-site generator.

As illustrated in FIGS. 1A-1B, the lower module 102 includes two warm air plenums 120 that are positioned, respectively, above and between a pair of rows of racks 105. A warm air aisle 122 is defined between the pair of rows of racks 105 and below the warm air plenum 120. A sealing interface 180 (e.g., sheet metal, flexible vinyl, or other sealing material) couple a bottom edge of the warm air plenum 120 to top edges of the rows of racks 105. The sealing interfaces 180 may prevent or substantially prevent (e.g., with little air leakage) air that is circulated from the warm air aisle 122 to the warm air plenum 120 to escape into a human-occupiable workspace 110 of the data center.

The warm air plenum 120 includes an outlet 130 that, in this example, extends through a ceiling member 125 (e.g., drop-down ceiling or otherwise) that separates the human-occupiable workspace 110 from a ceiling space 112 of the data center. The upper module 135 is, in this example, mounted in the ceiling space 112 and includes vertical panels 140 formed about a horizontal panel 145 to define a cold air space 114.

The lower module 102 may further support power supply equipment electrically coupled to the heat-generating devices 194. For example, in some aspects, the lower module 102 may include or support bus ducts, cable trays, power tap boxes, or other power supply equipment coupled to the heat-generating devices or cooling equipment (e.g., the one or more fans 155, control valves, temperature sensors, pressure sensors, fan motor controllers, and otherwise).

The upper module 135 further includes one or more cooling modules 150 mounted in between the vertical panels 140 around the cold air space 114. The cooling modules 150, for example, may be cooling coils (e.g., water, glycol, refrigerant, or otherwise), heat pipes, Peltier cooling modules, or other heat transfer devices. In this example, the cooling modules 150 may be interchangeable with the vertical panels 140, which are solid as to block airflow therethrough. Thus, a vertical panel 140 may be replaced with a cooling module 150 (e.g., to add cooling capacity to the data center cooling module 100). Alternatively, a cooling module 150 may be replaced with a vertical panel 140 to decrease cooling capacity.

The upper module 135 further includes one or more fans 155 mounted in the horizontal panel 145. In this example, the one or more fans 155 (e.g., axial flow, centrifugal, or otherwise) are mounted to circulate air within the data center cooling module 100. As illustrated, the one or more fans 155 are mounted above a cold air aisle 115 that is defined between adjacent rows of racks 105 and underneath the cold air space 114 and horizontal panel 145.

The data center cooling module 100, as shown in FIG. 1A, includes a partition 160. The partition 160, in this example, is a solid or substantially solid panel that prevents or substantially prevents airflow therethrough. The partition 160, in some implementations, may be moveable within the ceiling space 112 to alter or block one or more airflows that are circulated within the data center cooling module 100. For example, the partition 160 may be mounted orthogonally to a particular vertical panel 140 across the outlet 130 of the warm air plenum 120 to divide an airflow exiting the warm air plenum 120 into the ceiling space 112. The partition 160 may be mounted in parallel to the cooling modules 150 at a corner of the upper module 135 (e.g., as shown in FIG. 1A) to alter or block an airflow between two adjacent data center cooling modules 100. In some aspects, the partition 160 may be positioned to alter or direct an airflow to provide more or less cooling airflow to a particular rack 105 or group of racks 105 based on, for example, an operational parameter (e.g., input power, operating temperature, operating frequency, or otherwise) of the heat-generating devices 194.

As another example, the partition 160, or multiple partitions 160, may be positioned to segregate an airflow (or airflows) between a finished portion of the data center and an unfinished portion of the data center that is under constructions. For example, in some aspects, multiple data center cooling modules 100 may be serially installed within a data center according to a particular construction schedule. If one or more data center cooling modules 100 are operating within a finished portion of the data center (e.g., with operating devices 194) while another portion of the data center is under construction, it may be preferable to prevent dirty airflow (e.g., with dust, particulate, and other contaminants) from being circulated to the finished portion with the partitions 160.

As illustrated in FIG. 1B, one or more components of the data center cooling module 100 may be coupled to, anchored to, or otherwise supported by a structure of a data center building that encloses the data center cooling module 100. For example, as shown in FIG. 1B, a support column 185 may be positioned to support the data center building at a location within the human-occupiable workspace 110 at which the data center module 100 is installed. In this example, for example, one or more components of the lower module 102 (e.g., a warm air plenum 120) may be attached to the column 185. As another example, a complete module (e.g., upper module 135) may be attached to the column 185 (or other building structure, such as a beam or joist). In some aspects, a rail system may be positioned on the column 185 (or other building structure, such as a beam or joist) and the module (e.g., upper module 135) may be moveable on the rail system, e.g., to position the module during construction or re-position the module after construction.

In some alternative aspects of the data center cooling module 100, one or more packaged fan coil units may be installed in the upper module 135 (e.g., within the cold air space 114) and operated to cool an airflow used to cool the heat-generating devices 194. For example, in some aspects, cooling coils 150 may be replaced with airflow pathways (e.g., perforated vertical panels 140, filters, or otherwise) to allow an airflow to circulate from the warm air plenum 120 into the cold air space 114. The fan coil units mounted in the cold air space 114 may receive such an airflow for conditioning (e.g., cooling, cleaning, or both) before circulating the airflow back into the human-occupiable workspace 110.

In an example operation of the data center cooling module 100, a cooling airflow 175 is circulated, by the one or more fans 155, through the racks 105 by the one or more fans 155 from the human-occupiable workspace 110 and cold air aisle 115. As the cooling airflow 175 passes through the racks 105, heat (e.g., sensible heat) is transferred from the heat-generating devices 194 into the cooling airflow 175. In some aspects, an amount of heat transferred to the cooling airflow 175 depends on an operating condition of the heat-generating devices 194, such as an operating power or frequency condition, an operating temperature, or otherwise.

A heated airflow 170 exits the racks 105, which includes the heat transferred to the cooling airflow 175, into the warm air aisle 122 between two rows of racks 105. The heated airflow 170 is circulated, by the one or more fans 155, from the warm air aisle 122 through the warm air plenum and into the ceiling space 114 from the outlet 130 of the plenum 120. The heated airflow 170 is circulated through one or more cooling modules 150 and cooled.

The cooling airflow 175 exits the cooling modules 150 and is circulated, by the one or more fans 155, into the cold air space 114. The cooling airflow 175 is then circulated from the cold air space 114 into the cold air aisle 115 (or human-occupiable workspace 110, or both). The cooling airflow 175 then is circulated again through the racks 105 to cool the heat-generating electronic devices 194.

Figure 2:
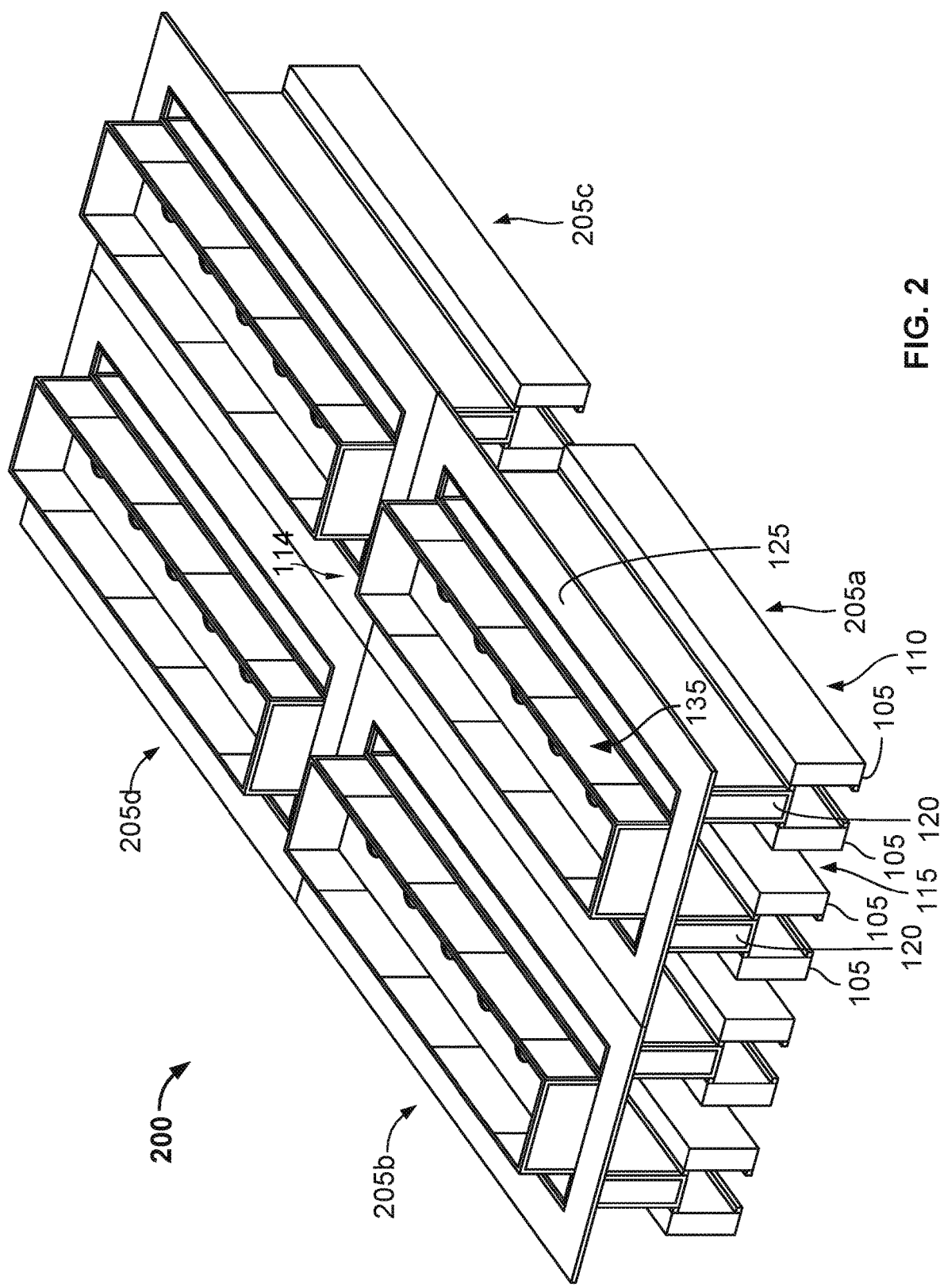
FIG. 2 is an isometric view of a schematic illustration of a data center system comprised of multiple scalable data center cooling modules according to the present disclosure.

FIG. 2 is an isometric view of a schematic illustration of a data center system 200 comprised of multiple scalable data center cooling modules. In this example, there are four data center cooling modules 205a through 205d, each of which may be identical to or similar to the data center cooling module 100 shown in FIGS. 1A-1B. Each data center module 205a-205d may add a specific amount of computing power (e.g., 1 MW, 3 MW, or other amount) to the data center system 200 and may be installed, e.g., incrementally, to add such amount of computing power according to, for example, a fixed schedule or as when more computing power is needed. Once installed, each data center cooling module 205a through 205d may operate identical to or similar to the data center cooling module 100 shown in FIGS. 1A-1B.

For example, in some aspects, each data center cooling module 205a-205d may include 3 MW of computing power, e.g., by the heat-generating electronic devices 194 mounted within the racks 105. The first module 205a may be installed into a data center building or mobile container and operated for a particular period of time. Subsequently, due to a fixed or pre-determined schedule, or when a determination is made that an additional amount of computing power is needed, the next module 205b may be installed, commissioned, and operated. Subsequently, additional modules (e.g., modules 205c and 205d) may be installed to add fixed amounts of computing power to the data center system 200.

In another example, one or more modules 205a through 205d, once operating, may be taken "offline" without physical removal from the system 200. In some aspects, the module 205a may be taken offline by removing power from the heat-generating electronic devices 194, the cooling equipment (e.g., fans 155), or both. Taking the module 205a offline may further include fluidly isolating the offline module 205a from other modules 205b through 205d. For example, partitions 160 may be mounted in the ceiling space 112 (e.g., above the ceiling panels 125). The partitions 160 may block or prevent airflow (e.g., a heated airflow) from being circulated from the online modules 205b-205d to the upper module 135 of the offline module 205a.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A data center cooling system, comprising:
a first module comprising a warm air plenum positionable to receive an airflow from one or more rows of racks that support a plurality of heat-generating electronic devices, the warm air plenum comprising a warmed air inlet adjacent an open side of the one or more rows of racks and a warmed air outlet adjacent a data center volume above the one or more rows of racks, the warmed air inlet comprising a perimeter edge in contact with a top portion of a first row of the one or more rows of racks and a top portion of a second row of the one or more rows of racks that is positioned parallel to and opposite a warm air aisle defined between the first and second rows of racks to form a barrier between the top portions of the first and second rows of racks and the first module, where the barrier substantially prevents airflow from a portion of a human-occupiable workspace of the data center adjacent open front sides of the one or more racks to the warm air inlet;
a second module positionable in the data center volume above the one or more rows of racks and comprising:
a horizontal bottom panel;
a plurality of vertical side panels coupled to the horizontal bottom panel;
at least one cooling module vertically mounted adjacent at least one of the vertical side panels; and
at least one fan, the at least one fan positioned to circulate a warmed airflow from the one or more rows of racks, through the warmed air plenum, into the data center volume, through the at least one cooling module to cool the warmed airflow, and into the human-occupiable workspace of the data center adjacent the one or more rows of racks; and an airflow partition mountable in the data center volume above the one or more rows of racks and adjustable to interrupt the warmed airflow between the warmed air plenum and the second module, wherein the warmed air outlet defines an opening in a ceiling panel that extends horizontally over and above the first and second rows of racks such that the warm air plenum is open to the data center volume at or above the ceiling panel, and the at least one cooling module of the second module is disposed adjacent to the opening in the ceiling panel, and the at least one fan is positioned to circulate a cooled airflow from the at least one cooling module into the human-occupiable workspace of the data center and through the open front sides of the one or more rows of racks.

2. The data center cooling system of claim 1, wherein at least one of the first or second modules is attachable to a structural column of the data center.

3. The data center cooling system of claim 2, wherein the first or second module is moveable along the structural column.

4. The data center cooling system of claim 1, wherein the at least one cooling module comprises a cooling coil.

5. The data center cooling system of claim 1, wherein at least one of the vertical side panels is sized for replacement with another of the at least one cooling module.

6. The data center cooling system of claim 1, wherein the at least one fan is mounted in the horizontal bottom panel to circulate the warmed airflow orthogonally from the warmed air plenum, through the warm air outlet, into the data center volume above the horizontal bottom panel, and through the at least one cooling module.

7. The data center cooling system of claim 1, wherein the at least one cooling module comprises a cooling coil vertically mounted adjacent at least one of the vertical side panels, and at least another of the vertical side panels is sized for replacement with another of the at least one cooling module, and the at least one fan is mounted in the horizontal bottom panel to circulate the warmed airflow orthogonally from the warmed air plenum through the at least one cooling module.

8. The data center cooling system of claim 7, wherein the perimeter edge of the warmed air inlet of the first module comprises at least one flexible interface attachable between the warmed air plenum and the top portions of the first and second rows of racks, the flexible interface comprising a fluid seal between the first and second rows of racks and the first module.

9. The data center cooling system of claim 8, wherein the ceiling panel is attachable to at least one of the first module or the second module, the ceiling panel defining an interface between the human-occupiable workspace and the data center volume above the one or more rows of racks.

10. The data center cooling system of claim 1, wherein the perimeter edge of the warmed air inlet of the first module comprises at least one flexible interface attachable between the warmed air plenum and the top portions of the first and second rows of racks, the flexible interface comprising a fluid seal between the first and second rows of racks and the first module.

11. The data center cooling system of claim 1, wherein the ceiling panel is horizontally attachable to at least one of the first module or the second module, the ceiling panel defining an interface between the human-occupiable workspace and the data center volume above the one or more rows of racks.

12. A method of cooling a data center, comprising:
circulating an airflow, to a warm air plenum of a first module, from one or more rows of racks that support a plurality of heat-generating electronic devices, the warm air plenum comprising a warmed air inlet adjacent an open side of the one or more rows of racks, the warmed air inlet comprising a perimeter edge in contact with a top portion of a first row of the one or more rows of racks and a top portion of a second row of the one or more rows of racks that is positioned parallel to and opposite a warm air aisle defined between the first and second rows of racks;

substantially preventing airflow from a human-occupiable workspace of the data center adjacent open front sides of the one or more rows of racks to the warm air inlet between the top portions of the first and second rows of racks and the first module; warming the airflow as the airflow is circulated through the one or more rows of racks; circulating the warmed airflow through the warm air inlet of the warm air plenum that is adjacent the open side of the one or more rows of racks and to a warmed air outlet of the warm air plenum that is adjacent a data center volume above the one or more rows of racks;

circulating the warmed airflow through the warmed air outlet that defines an opening in a ceiling panel that extends horizontally over and above the first and second rows of racks and into the data center volume at or above the ceiling panel;

circulating the warmed airflow to a second module positionable in the data center volume above the one or more rows of racks, the second module comprises a horizontal bottom panel, a plurality of vertical side panels coupled to the horizontal bottom panel, a fan, and at least one cooling module vertically mounted adjacent at least one of the vertical side panels and disposed adjacent to the opening in the ceiling panel;

circulating the warmed airflow, with the fan through the at least one cooling module to cool the warmed airflow, and into the human-occupiable workspace of the data center adjacent the one or more rows of racks; and diverting the warmed airflow with an airflow partition mounted in the data center volume above the one or more rows of racks and adjustable to interrupt the warmed airflow between the warmed air plenum and the second module.

13. The method of claim 12, further comprising:
installing the first module in the human occupiable workspace of the data center;
installing the second module in the data center volume; and
attaching at least one of the first or second modules to a structural column of the data center.

14. The method of claim 13, further comprising:
detaching the portion of one of the first or second modules that is anchored to the structural column; and
moving the portion of one of the first or second modules along the structural column or to another column.

15. The method of claim 13, wherein the at least one cooling module comprises a cooling coil.

16. The method of claim 13, further comprising: replacing at least one of the vertical side panels with another of the at least one cooling module that comprises a cooling coil.

17. The method of claim 13, further comprising: mounting the fan in the horizontal bottom panel to circulate the warmed airflow orthogonally from the warmed air plenum through the at least one cooling module.

18. The method of claim 13, wherein the perimeter edge of the warmed air inlet of the first module comprises a flexible interface between the warmed air plenum and the top portions of the first and second rows of racks; the flexible interface comprising a fluid seal between the warm air aisle and the first module.

19. The method of claim 13, wherein the ceiling panel horizontally is attachable to at least one of the first module or the second module, the ceiling panel defining an interface between the human-occupiable workspace and the data center volume above the one or more rows of racks.

* * * * *